US010429475B2

(12) United States Patent
Polimeni et al.

(10) Patent No.: US 10,429,475 B2
(45) Date of Patent: Oct. 1, 2019

(54) METHOD FOR INCREASING SIGNAL-TO-NOISE RATIO IN MAGNETIC RESONANCE IMAGING USING PER-VOXEL NOISE COVARIANCE REGULARIZATION

(71) Applicants: Jonathan R. Polimeni, Cambridge, MA (US); Kawin Setsompop, Charlestown, MS (US); Lawrence L. Wald, Cambridge, MA (US)

(72) Inventors: Jonathan R. Polimeni, Cambridge, MA (US); Kawin Setsompop, Charlestown, MS (US); Lawrence L. Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 659 days.

(21) Appl. No.: 14/774,551

(22) PCT Filed: Mar. 12, 2014

(86) PCT No.: PCT/US2014/024247
§ 371 (c)(1),
(2) Date: Sep. 10, 2015

(87) PCT Pub. No.: WO2014/165050
PCT Pub. Date: Oct. 9, 2014

(65) Prior Publication Data
US 2016/0025833 A1    Jan. 28, 2016

Related U.S. Application Data

(60) Provisional application No. 61/776,991, filed on Mar. 12, 2013.

(51) Int. Cl.
*G01R 33/56* (2006.01)
*G01R 33/385* (2006.01)
(Continued)

(52) U.S. Cl.
CPC ....... *G01R 33/5608* (2013.01); *G01R 33/385* (2013.01); *G01R 33/5611* (2013.01); *G01V 3/14* (2013.01)

(58) Field of Classification Search
None
See application file for complete search history.

(56) References Cited

U.S. PATENT DOCUMENTS 7,342,397 B2 *   3/2008   Pruessmann ....... G01R 33/5611
                                                    324/307
7,394,252 B1 *   7/2008   Lin ................... G01R 33/5611
                                                    324/307
(Continued)

OTHER PUBLICATIONS

International Search Report and Written Opinion dated Jul. 29, 2014 for International Application No. PCT/US2014/024247.

*Primary Examiner* — Jermele M Hollington
(74) *Attorney, Agent, or Firm* — Quarles & Brady LLP

(57) ABSTRACT

A method for maximizing the signal-to-noise ratio ("SNR") in a combined image produced using a parallel magnetic resonance imaging ("MRI") technique is provided. The image combination used in such techniques require an accurate estimate of the noise covariance. Typically, the thermal noise covariance matrix is used as this estimate; however, in several applications, including accelerated parallel imaging and functional MRI, the noise covariance across the coil channels differs substantially from the thermal noise covariance. By combining the individual channels with more accurate estimates of the channel noise covariance, SNR in the combined data is significantly increased. This improved combination employs a regularization of noise covariance on a per-voxel basis.

17 Claims, 2 Drawing Sheets

(51) Int. Cl.
*G01V 3/14* (2006.01)
*G01R 33/561* (2006.01)

(56) References Cited

U.S. PATENT DOCUMENTS

| | | | |
|---|---|---|---|
| 7,570,054 B1 | 8/2009 | Lin | |
| 9,709,650 B2 * | 7/2017 | Trzasko | G01R 33/5611 |
| 2006/0186941 A1 * | 8/2006 | Pruessmann | G01R 33/5611 |
| | | | 327/307 |
| 2009/0179643 A1 * | 7/2009 | Lin | G01R 33/34084 |
| | | | 324/312 |
| 2009/0285463 A1 * | 11/2009 | Otazo | G06T 3/4053 |
| | | | 382/131 |
| 2012/0081114 A1 | 4/2012 | Weller et al. | |
| 2013/0088225 A1 * | 4/2013 | Weller | G01R 33/5611 |
| | | | 324/307 |
| 2013/0099786 A1 * | 4/2013 | Huang | G01R 33/246 |
| | | | 324/309 |
| 2013/0181711 A1 * | 7/2013 | Chaari | G01R 33/5611 |
| | | | 324/309 |
| 2013/0278260 A1 * | 10/2013 | Gopinath | G01R 33/56 |
| | | | 324/309 |
| 2014/0210469 A1 * | 7/2014 | Cheng | G01R 33/56509 |
| | | | 324/309 |
| 2016/0018498 A1 * | 1/2016 | Boernert | G01R 33/5611 |
| | | | 324/309 |
| 2017/0069115 A1 * | 3/2017 | Saito | G06T 11/005 |

\* cited by examiner

METHOD FOR INCREASING SIGNAL-TO-NOISE RATIO IN MAGNETIC RESONANCE IMAGING USING PER-VOXEL NOISE COVARIANCE REGULARIZATION

CROSS-REFERENCE TO RELATED APPLICATIONS

This application represents the U.S. National Stage of International Application No. PCT/US2014/024247, filed Mar. 12, 2014 which claims the benefit of U.S. Provisional Patent Application Ser. No. 61/776,991, filed on Mar. 12, 2013, and entitled "METHOD FOR INCREASING SIGNAL-TO-NOISE RATIO IN MAGNETIC RESONANCE IMAGING USING PER-VOXEL NOISE COVARIANCE REGULARIZATION."

BACKGROUND OF THE INVENTION

The field of the invention is systems and methods for magnetic resonance imaging ("MRI"). More particularly, the invention relates to systems and methods for improving signal-to-noise ratio in using a local, per-voxel estimation of noise covariance.

Parallel imaging with receive coil arrays provides many advantages for MRI, including increased image signal-to-noise ratio ("SNR") and the ability to reduce scan times using accelerated parallel imaging. Together, these advantages can increase the time efficiency of an MRI examination or enable new imaging techniques afforded by the increased sensitivity or speed of the acquisition.

When receiving the MRI data in a set of receiver coils in parallel, the data from each independent channel must be combined to form a single image. There are several approaches to this combination, and with extra information about the coupling of the data across the array a combination can be performed that maximizes the final SNR. Typically this coupling is estimated with a pre-scan that measures the intrinsic coupling of thermal noise across the detectors for the given object being imaged, and this coupling depends both on how the coil detectors couple to the object and on how the detectors couple with one another. This coupling, given by the noise covariance matrix, can then be integrated into the combination for increased SNR and a subsequent increase in imaging performance. The noise covariance across channels, however, can be affected by the accelerated parallel imaging algorithm.

Image reconstruction algorithms used in parallel imaging techniques often combine information across the channels of the coil array and, therefore, affect the noise coupling in the resulting individual channel images to be combined. Also, in some applications the image SNR is not the quantity that should be maximized. For example, in functional MRI, the temporal SNR is the quantity of interest that should be maximized to optimize the ability to detect subtle brain activations in the time-series data. To maximize the temporal SNR, the coil combination must take into account the coupling of the time-series data across the coil array channels. This coupling is affected by the physiological noise and other system instabilities and temporal fluctuations.

SUMMARY OF THE INVENTION

The present invention overcomes the aforementioned drawbacks by providing a method for producing an image of a subject using a magnetic resonance imaging ("MRI") system. The MRI system, which includes an array of radio frequency ("RF") receiver coils, is used to acquire k-space data from a subject. An image for each receiver coil is reconstructed from the k-space data acquired from that receiver coil. A noise covariance matrix is then estimated for each voxel in each reconstructed image. An image of the subject is then produced by weighting and combining the reconstructed "coil" images while regularizing the noise covariance matrices on a per-voxel basis.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
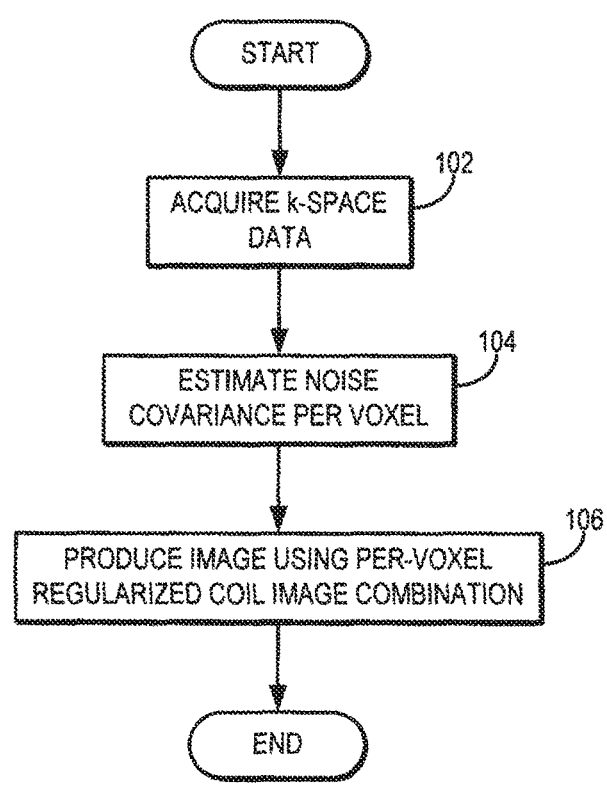
FIG. 1 is a flowchart setting forth the steps of an example of a method for combining coil images using a per-voxel regularization of noise covariance.

Image reconstruction of parallel imaging data can affect the noise correlations across the coil channels so that the noise covariance matrix across the coils both differs from the thermal noise covariance and varies from voxel to voxel in the image domain. For accelerated image acquisitions the image reconstruction can impose these spatially varying correlations, and for unaccelerated fMRI time series data the presence of physiological noise also leads to spatially varying correlations. In each of these cases, the noise covariance matrix can be poorly conditioned; thus, using the voxelwise noise covariance matrix in the image combination leads to image artifacts or little SNR gain. Voxelwise regularization of this matrix, however, can improve image quality and substantially boost the final image SNR by improving the numerical conditioning of the voxelwise covariance.

Currently, the noise covariance matrix is calculated for each voxel by estimating the noise statistics across many repetitions of the image reconstruction, either from synthetic data or from time-series data. Because of the large number of repetitions needed to accurately estimate this matrix, and because the required number of repetitions needed for a given level of accuracy increases with the number of channels in a coil array, this method for estimating the noise covariance can be prohibitively time consuming for some applications. In the case of the GRAPPA-reconstructed data, it may be possible to calculate the image-domain noise covariance matrix analytically, obviating the need for the many repetitions. Physiological noise appears to be spatially correlated and with different statistics in different tissue classes. Thus, to estimate the time-series noise covariance matrices for fMRI data it may be possible to pool the time series from neighboring voxels within a tissue class to increase the number of noise samples within a given measurement, thereby reducing the number of required repetitions. Similar benefits may be possible for SENSE reconstructions, which can be viewed as a special case of the GRAPPA algorithm and can be formulated as a two-stage algorithm that first generates uncombined data that is later combined.

Individual images acquired across multiple channels of a phased array coil can be combined in such a way as to maximize the signal-to-noise ratio ("SNR") the combined image. This combination requires an accurate estimate of the noise covariance. Typically, the thermal noise covariance matrix is used as this estimate; however, in several applications, including accelerated parallel imaging and functional magnetic resonance imaging ("MRI"), the noise covariance across the coil channels differs substantially from the thermal noise covariance. By combining the individual channels with more accurate estimates of the channel noise covariance, SNR in the combined data can be increased by as much as forty percent. This improved combination requires a regularization step, and the degree of regularization controls a trade-off between increased SNR and increased image artifacts.

MRI acquisitions with N coil detectors acquire N images in parallel—one per receiver channel—and typically in the final stages of the image reconstruction these N images are combined to generate a single, magnitude-valued image. The method chosen for combining the individual channels can have a substantial impact on the SNR of the final image. The SNR of a combined image at a single image voxel is given by $$SNR = \frac{|w^H s|}{\sqrt{w^H \psi w}}; \quad (1)$$

where s is an N×1 vector of complex-valued intensity values across the N coils; ψ is the complex-valued, Hermitian N×N noise covariance matrix; w is the N×1 vector of complex-valued combination weights; and $w^H$ indicates the Hermitian transpose of the combination weights vector, w.

The noise covariance matrix captures the noise coupling between the individual channel images and therefore represents an image noise covariance. Typically this matrix is estimated from a noise-only acquisition, during which RF excitation is disabled and samples of thermal noise are acquired using a receiver bandwidth identical to the image acquisition. This type of acquisition results in an estimate of thermal noise covariance that essentially measures the noise covariance in the raw k-space data. It is generally valid to use the thermal noise covariance in place of the image noise covariance because the discrete Fourier transform, which is applied to transform the k-space data into the image domain, is unitary and, therefore, does not affect the noise statistics. For this reason, the image noise covariance and thermal noise covariance are generally assumed to be equivalent for conventional image reconstructions.

The weights, w, used in the combination can greatly influence the final SNR. It has been previously shown that the weights that optimize the SNR resulting from the combination are given by $$w = \lambda \psi^{-1} b \quad (2);$$

where b is an N×1 vector representing the coil detector sensitivity profiles at the voxel and λ is a scalar-valued normalization factor that does not influence the final SNR. Note that this is equivalent to a SENSE reconstruction in the special case of unaccelerated data (Pruessmann, Weiger, Scheldegger, & Boesiger, 1999). In this case, the final, combined image is given by $$c = |w^H s| = \lambda |b^H \psi^{-1} s| \quad (3).$$

Often, it is assumed that the image intensity vector, s, is a good approximation for b, in which case the SNR of the optimal combination weights is given by $$SNR_{cov} = \sqrt{s^H \psi^{-1} s} \quad (4).$$

This version of the optimal combination, where the coil sensitivities are approximated by the image intensities, is often simply called the noise covariance-weighted combination (Triantafyllou, Polimeni, & Wald, 2011). It results in an SNR that is nearly the optimal SNR, but does not require the extra step of estimating coil sensitivity profiles.

When it is further assumed that the noise covariance matrix, ψ, is the identity matrix and when the noise weighting is omitted from the combination weights, w, the final image combination is equivalent to the conventional root-sum-of-squares (RSS) combination, with the resulting SNR given by $$SNR_{rss} = \frac{s^H s}{\sqrt{s^H \psi s}}. \quad (5)$$

Even though the RSS combination assumes that the noise covariance matrix, ψ, is the identity, an accurate assessment of the SNR must include the "true" noise covariance matrix. Note that the further the true noise covariance matrix is from the identity matrix the more $SNR_{rss}$ will differ from the optimal combination SNR, and that as the product, $s^H \psi s$, increases, $SNR_{rss}$, will decrease. For this reason, $SNR_{rss}$ is less than or equal to $SNR_{cov}$, although generally $SNR_{rss}$ is less than $SNR_{cov}$.

When the noise covariance matrix is known, the SNR can be calculated with the above expressions. However, an alternate method for estimating SNR is available. The SNR can be calculated by estimating the signal levels and noise levels directly from the reconstructed images. This can be performed by computing statistics of both the signal and noise over an ensemble of instances of the image. If an image acquisition can be repeated identically multiple times, for each combined image voxel the mean intensity across the repetitions provides an estimate of the signal level. Additionally, the standard deviation of the intensity across the repetitions provides an estimate of the noise level. Thus, the ratio of these two parameters provides an estimate of the SNR. This is often referred to as the time-series SNR. If multiple repetitions of the image are not available, it is possible to calculate time-series SNR from a Monte Carlo simulation that adds noise to a single example of the acquired k-space with the same statistics (i.e., the same noise covariance) as was measured from the data, then repeats this for many replicates, ultimately forming a synthetic time-series dataset from which the time-series SNR can be directly calculated (Polimeni, Wiggins, & Wald, 2008; Robson et al., 2008).

The SNR in the combined data is optimized by weighting the individual channels by their noise covariance, which effectively down-weights noisy channels and promotes channels with low noise levels in a way that simultaneously accounts for the coupling of noise across channels as well, thereby minimizing noise in the final combined image. The appropriate "noise" that is the basis for this weighting can be problem- or application-specific. Typically, it is the image noise that should be minimized, and this can be calculated by propagating the thermal noise (i.e., the noise in k-space) through the steps of the image reconstruction while accounting for any steps that affect the noise statistics. In the special case of a simple reconstruction including only the application of the discrete Fourier transform, the image noise and thermal noise are equivalent. However, in the case of a GRAPPA reconstruction of accelerated parallel imaging data, the application of the GRAPPA kernel estimates the missing data lines (skipped in the course of accelerating the image encoding during data acquisition) by forming linear combinations of the acquired data across all coils, which will impact the image noise covariance of the resulting images. Because the GRAPPA kernel can be viewed as a convolution operation in k-space, it is equivalent to a multiplicative filter in the image domain, and so it is expected that not only will the image noise covariance matrix be affected by the GRAPPA method but it is also expected to vary over space. Therefore, the appropriate noise covariance matrix for GRAPPA-reconstructed image data varies from voxel-to-voxel and is different from the thermal noise covariance matrix.

In the case of fMRI time-series data, it is the time-series SNR that is most relevant because it characterizes how well subtle brain activation signals can be detected within the measured data in the presence of time-series fluctuations. These fluctuations can be due to system instabilities as well as a category of noise sources called "physiological noise." Because the time-series noise should be minimized to increase the detection of fMRI activations, it would be appropriate to use a time-series noise covariance matrix as a channel weighting for combining fMRI data. This noise covariance matrix can be calculated from the uncombined time-series data directly in the image domain, and its entries will reflect the coupling of the fluctuations due to system instability and physiological noise across the coil channels. It is noted that time-series covariance matrices can also be estimated from a time series of images obtained in a pre-scan. Because each coil element will only be sensitive to signals within the voxels that are in close spatial proximity to the coil, this matrix is expected to have a substantially different structure across the image, and therefore must be calculated for each image voxel separately. A physiological noise covariance matrix can be derived from this time-series noise covariance matrix, which can provide a useful characterization of the time-series data as well.

For the foregoing reasons, different noise covariance matrices can be used as the noise covariance matrix, $\psi$, used in the coil combination weighting. Again, these different noise covariance matrices include the thermal noise covariance matrix, the image noise covariance matrix, and the time-series noise covariance matrix.

The combined images are typically required to be magnitude-valued, and therefore, because the weights are allowed to be complex-valued, the final step of the combination includes a magnitude operation. In the noise covariance-weighted combination, since covariance matrices are Hermitian, the product $$s^H \psi^{-1} s \quad (6);$$

formed in the calculation of c is naturally real-valued. Alternatively, this product can be phrased as $$\tilde{s}^H \tilde{s} \quad (7);$$

where the new vector, $\tilde{s}$, given by $$\tilde{s} = Qs$$

is the whitened version of s under the white transformation, Q, given by the following decomposition:

$$Q^H Q = \psi^{-1} \quad (8);$$

which can be calculated directly using, for example, a Cholesky decomposition. Intuitively, the transformation, Q, removes the noise correlation in s, such that the noise covariance of the data represented by $\tilde{s}$ is simply the identity matrix (i.e., the noise in $\tilde{s}$ is "white"). Thus, the combined image can be expressed in two equivalent ways, $$c = \sqrt{s^H \psi^{-1} s} = \sqrt{\tilde{s}^H \tilde{s}} \quad (9);$$

and so it can be seen that the noise covariance-weighted combination of a is identical to an RSS combination of $\tilde{s}$. In other words, any noise covariance-weighted combination is equivalent to a RSS combination of a whitened version of the data. One important implication of this is related to the implicit magnitude operation involved.

The magnitude operator is known to impose a bias on the noise statistics of MRI data due to the fact that thermal noise is zero-mean and complex-valued. This bias scales with signal level and with the number of coil channels in the combination. The scaling with the number of channels can be understood intuitively by considering that an RSS combination is essentially the sum of N magnitude images, so the bias is compounded across the coils. Because a noise covariance-weighted combination is equivalent to a RSS combination, both combinations suffer from the same noise bias.

Referring now to FIG. 1, a flowchart setting forth the steps of a method for estimating a local (e.g. voxelwise) noise covariance matrix and using it in a weighted coil combination is illustrated. First, k-space data is acquired with a magnetic resonance imaging ("MRI") system, as indicated at step 102. This k-space data may be acquired, for instance, using an accelerated data acquisition scheme in which k-space is undersampled along at least one direction and in which data is acquired using an array of RF coils. After the k-space data is acquired, image noise covariance matrices are calculated, as indicated at step 104. These image noise covariance matrices are calculated on a per-voxel basis as described above. Once the per-voxel noise covariance has been estimated, a weighted combination of the individual coil images is computed for each image voxel using Eqn. (9), as indicated at step 106. Note, however, that this expression contains the inverse of the noise covariance matrix, $\psi$, therefore in cases where has a low matrix rank or poor numerical conditioning, this inversion will be unstable and the product formed in Eqn. (4) will amplify noise in the vector, s. Thus, it is preferable to regularize this inversion in order to reduce the noise amplification stemming from the poor conditioning.

There are many approaches to improving the conditioning of Eqn. (9) via regularization, such as standard regularization. The degree of regularization applied can be parameterized in several ways, including through the value of a Tikhonov regularization parameter, or through the truncated singular value decomposition ("SVD") approach. In the truncated SVD approach, the SVD of the matrix to be inverted is computed, the singular vectors sorted by their corresponding singular values, and only the singular vectors with the largest singular values are retained. The matrix product in Eqn. (6) is then formed from this subset of singular vectors. Two examples of ways to specify the degree of regularization are as follows. In one example, the number of singular vectors to retain is explicitly specified. In another example, a desired condition number of the resulting truncated matrix is specified, and the number of singular vectors that achieves this conditioning is identified.

In the Tikhonov approach, the conditioning is similarly improved by adding an additional constraint on the solution to suppress noise, and the influence of this side constraint is controlled by a regularization parameter. A special case of the Tikhonov regularization can also be viewed as filtering the singular vectors in such a way as to suppress contributions from those corresponding to small singular values. Methods exist for automatically selecting the level of Tikhonov regularization, such as the L-curve method.

The noise covariance matrices in images reconstructed from undersampled k-space data using an accelerated parallel image reconstruction technique, such as GRAPPA, differ across image voxels due to the spatially varying mixing of k-space data that takes place during the application of the reconstruction kernel. For instance, at one location in the image domain the noise covariance matrix may be diagonally dominant and similar to that of the unaccelerated data, with a similar condition number (i.e., 45). However, at another image location, the noise covariance matrix is likely to differ substantially from that of the unaccelerated case, for instance with a less pronounced diagonal and a cluster of high correlations seen around a small subset of coils. This latter scenario results in a dramatically higher condition number (i.e., 13447). Therefore, the noise covariance across the coil channels can change dramatically over a GRAPPA reconstructed image, and the condition number of the noise covariance matrix changes as well, indicating that the inversion of the voxelwise noise covariance will lead to a spatially nonuniform noise propagation across the image during the coil channel combination if the voxelwise covariance matrices are not somehow regularized.

It is contemplated that the condition number will vary somewhat smoothly across an image without many rapid changes or discontinuities. It is also contemplated that the condition number will peak near the center of the imaging field-of-view at the point farthest away from the coil detectors. More generally, it is contemplated that the spatial pattern of the condition number will correspond well to the g-factor pattern seen in GRAPPA image reconstructions. To account for the spatially varying condition number in the coil channel combination, numerical regularization can be applied to reduce the impact of the instable inversion on the combination, as described above.

Pre-whitening the k-space data prior to GRAPPA kernel fitting and reconstruction yields new k-space data, for which the thermal noise covariance is the identity matrix. This pre-whitening may be beneficial for calculating the GRAPPA kernel from reference data because it transforms the reference data into equivalent reference lines for which each channel has the same noise level and the noise is uncorrelated across channels. Because the GRAPPA method changes the image noise covariance of the reconstructed images, however, the pre-whitened data after image reconstruction will still have a spatially varying image noise covariance, and the structure of this covariance matrix will be determined by the GRAPPA kernel coefficients, just as in the case of non-whitened data. As in the case of the non-whitened data, the resulting image noise covariance matrix varies spatially from voxel to voxel; the application of the GRAPPA kernel mixes the noise contributions across channels, which imposes new correlations across the uncombined images.

An increase in SNR relative to conventional parallel image reconstruction can be achieved when the appropriate voxelwise noise covariance matrix is used for the coil combination. Because of the spatially varying condition number, however, the straightforward use of the voxelwise noise covariance results in image artifacts in the combined image, such as artifacts that will appear as aliasing artifacts along the phase encoding direction. These artifacts are mitigated by introducing the aforementioned regularization, albeit at the expense of some of the otherwise increased SNR in the non-regularized case.

The time-series noise covariance matrix norm varies in different tissue types, suggesting that differences in physiological noise characteristics across these tissue classes affects the time-series noise covariance matrix and its condition number. This spatially varying matrix norm may result in the loss of anatomical detail and image contrast because it is not properly accounted for in conventional image reconstruction techniques. The matrix norm represents the overall scaling of the matrix, and voxelwise noise covariance matrix weighting has a spatially varying scale factor or gain that varies with the tissue class. One approach to remove the effects of this scaling is to simply multiply the combined image reconstruction with the spatial map of the matrix norm. Another approach would be to normalize the voxelwise time-series noise covariance matrices at each voxel by a per-voxel scale factor so that the matrix 2-norm is identical at each voxel of the image. Because this normalization scales both the image intensities and the noise equally, the normalization does not affect the final SNR—similar to the "uniform signal" and "uniform noise" normalizations that are sometimes used in combining coil array data.

It is contemplated that with the provided method, both high time-series SNR and low artifact levels can be achieved when only a small number of channel modes are used in a combination, where the number of channel modes is controlled by the truncation level of the truncated SVD regularization. For instance, time-series SNR is expected to drop with increasing number of channel modes. There are many possible approaches to regularize the noise covariance matrix and to parameterize the regularization in a way that is convenient and suitable for a given application. It is contemplated that the SNR gains achieved with the method of the present invention will depend on the details of the acquisition and image reconstruction.

Figure 2:
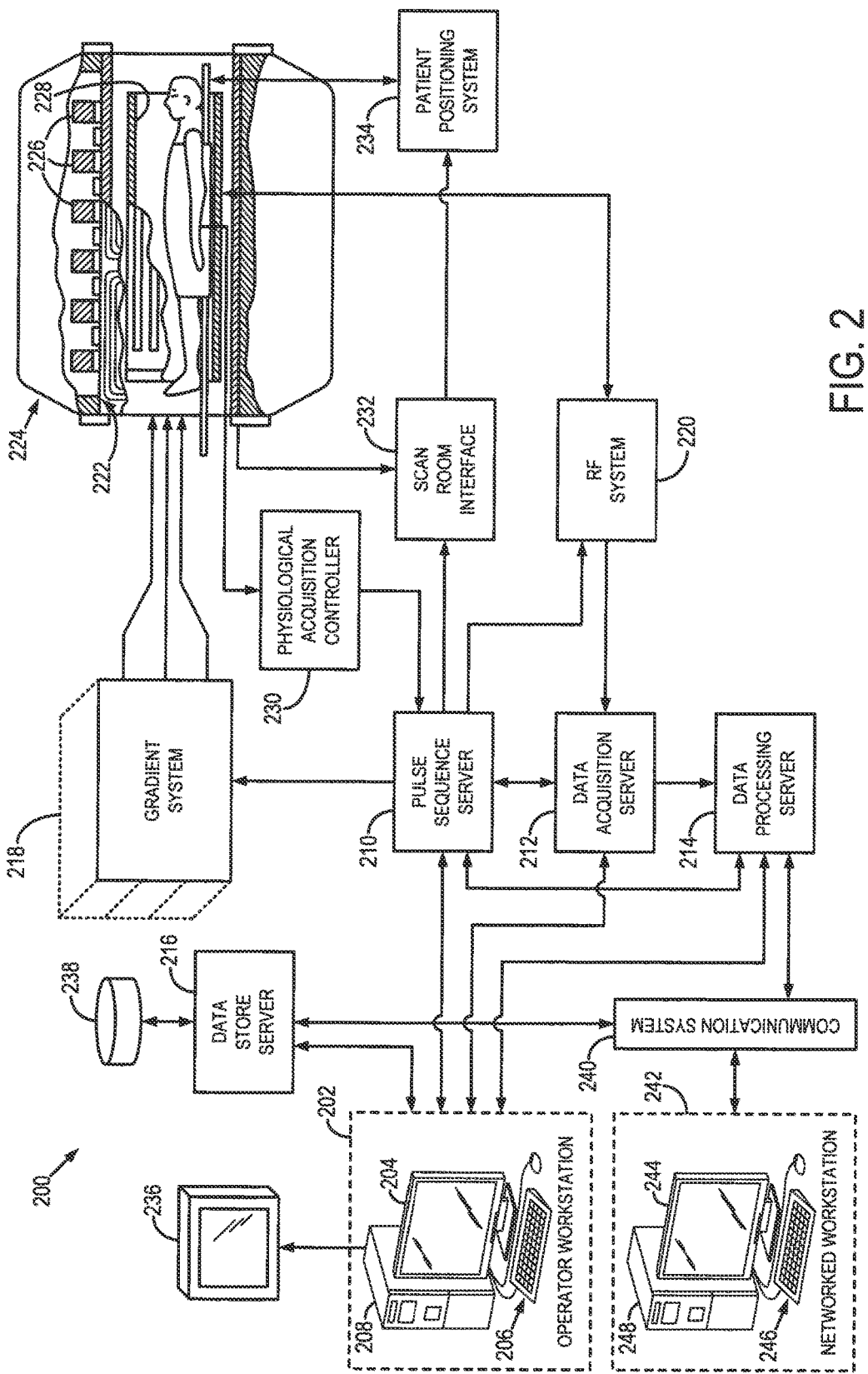
FIG. 2 is a block diagram of an example of a magnetic resonance imaging ("MRI") system.

Referring particularly now to FIG. 2, an example of a magnetic resonance imaging ("MRI") system 200 is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the Internet.

The pulse sequence server 210 functions in response to instructions downloaded from the operator workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad (10);$$

and the phase of the received magnetic resonance signal may also be determined according to the following relationship:

$$\varphi = \tan^{-1}\left(\frac{Q}{I}\right). \qquad (11)$$

The pulse sequence server 210 also optionally receives patient data from a physiological acquisition controller 230. By way of example, the physiological acquisition controller 230 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also be employed to process magnetic resonance signals used to detect the arrival of a contrast agent in a magnetic resonance angiography ("MRA") scan. By way of example, the data acquisition server 212 acquires magnetic resonance data and processes it in real-time to produce information that is used to control the scan.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

Here, a generalized system for maximizing the relevant signal-to-noise ratio in parallel imaging data has been provided. For accelerated parallel imaging reconstruction techniques, the image noise covariance is not treated as a fixed, global quantity, but rather as a quantity that varies spatially and must be computed on a voxel-by-voxel basis. Similarly, the temporal noise covariance in functional MRI time series data varies spatially. In both cases, the combination is complicated by the low numerical rank of the noise covariance matrix, and a "per-voxel" regularization has been introduced to maximize the final signal-to-noise ratio of the combined image.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject using a magnetic resonance imaging (MRI) system, the steps of the method comprising:
    a) acquiring k-space data from the subject using an MRI system that includes an array of radio frequency (RF) receiver coils;
    b) reconstructing an image for each receiver coil from the k-space data acquired in step a) from that receiver coil;
    c) estimating a noise covariance matrix for each voxel in each image reconstructed in step b);
    d) producing an image of the subject by weighting and combining the images reconstructed in step b) while regularizing the noise covariance matrices on a per-voxel basis.

2. The method as recited in claim 1 in which step d) includes regularizing the noise covariance matrices by performing a truncated singular value decomposition of the noise covariance matrices.

3. The method as recited in claim 2 in which step d) includes multiplying signals in the images reconstructed in step b) with a subset of singular values computed in the truncated singular value decomposition of the noise covariance matrices.

4. The method as recited in claim 3 in which the subset of singular values includes a selected number of the largest computed singular values.

5. The method as recited in claim 2 in which the truncated singular value decomposition produces a truncated matrix of singular values having a specified condition number.

6. The method as recited in claim 5 in which the specified condition number is selected to control the regularization of the noise covariance matrices.

7. The method as recited in claim 6 in which step d) includes determining a number of singular vectors that results in the specified condition number.

8. The method as recited in claim 1 in which the noise covariance matrices estimated in step c) are image-domain noise covariance matrices.

9. The method as recited in claim 8 in which the k-space data acquired in step a) is accelerated k-space data that is acquired by undersampling k-space, and in which step c) includes estimating the Image-domain noise covariance matrices from accelerated k-space data.

10. The method as recited in claim 9 further comprising acquiring pre-scan k-space data in which RF excitation is disabled, and in which step c) includes analytically deriving the image-domain noise covariance matrix for each voxel in each image reconstructed in step b) from the pre-scan k-space data.

11. The method as recited in claim 1 in which the k-space data acquired in step a) is representative of a time-series of images, and in which the noise covariance matrices estimated in step c) are time-series noise covariance matrices.

12. The method as recited in claim 11 further comprising acquiring pre-scan k-space data and reconstructing a time series of Images from the acquired pre-scan k-space data; and in which step c) includes estimating the time-series covariance matrices from the time series of images reconstructed from the acquired pre-scan k-space data.

13. The method as recited in claim 1 in which the noise covariance matrices estimated in step c) are noise covariance matrices that include combined effects of image-domain noise and time-series noise.

14. The method as recited in claim 1 in which step d) includes regularizing the noise covariance matrices by performing a Tikhonov regularization, and in which the performing the Tikhonov regularization includes selecting a regularization parameter.

15. The method as recited in claim 14 in which the regularization parameter is selected by empirically determining an optimal balance between artifact suppression and signal-to-noise ratio enhancement in the image of the subject.

16. The method as recited in claim 14 in which the regularization parameter is selected using an automatic technique for seeking a regularization parameter that achieves a balance between a data consistency term and a smoothness constraint term of a cost function.

17. The method as recited in claim 16 in which the automatic technique used to select the regularization parameter is an L-curve method.

* * * * *

UNITED STATES PATENT AND TRADEMARK OFFICE
CERTIFICATE OF CORRECTION

PATENT NO.         : 10,429,475 B2
APPLICATION NO.    : 14/774551
DATED              : October 1, 2019
INVENTOR(S)        : Jonathan R. Polimeni et al.

It is certified that error appears in the above-identified patent and that said Letters Patent is hereby corrected as shown below:

In the Specification

Column 3, Line 6, "(SNR) the" should read --(SNR) in the--.

Column 3, Line 64, "Scheldegger" should read --Scheidegger--.

Column 6, Line 10, "of a is" should read --of s is--.

Signed and Sealed this
Twelfth Day of November, 2019

Andrei Iancu
*Director of the United States Patent and Trademark Office*